United States Patent

Deutsch

[11] Patent Number: 5,688,627
[45] Date of Patent: Nov. 18, 1997

[54] LIGHT SENSITIVE DIAZONIUM COMPOUNDS HAVING BOTH BISULFATE AND ZINCATE PARTS, METHOD OF MAKING THE COMPOUNDS AND COMPOSITIONS UTILIZING THEM

[75] Inventor: Albert S. Deutsch, Hartsdale, N.Y.

[73] Assignee: Precision Lithograining Corp., South Hadley, Mass.

[21] Appl. No.: 677,438

[22] Filed: Jul. 2, 1996

[51] Int. Cl.⁶ ............................................. G03F 7/021
[52] U.S. Cl. .................... 430/157; 430/169; 430/175; 430/176; 430/272.1; 430/278.1; 534/561; 534/563
[58] Field of Search .................. 430/175, 176, 430/169, 157, 158, 171, 272.1, 278.1; 534/561, 563

[56] References Cited

U.S. PATENT DOCUMENTS

| | | |
|---|---|---|
| 3,382,069 | 5/1968 | Borchers et al. . |
| 3,765,894 | 10/1973 | Mellan . |
| 4,186,069 | 1/1980 | Muzyczko et al. ............ 430/175 |
| 4,224,398 | 9/1980 | Muzyczko et al. ............ 430/175 |
| 4,273,851 | 6/1981 | Muzyczko et al. ............ 430/175 |
| 4,288,520 | 9/1981 | Sprintschnik et al. ......... 430/169 |
| 4,522,910 | 6/1985 | Hallman ........................ 430/157 |
| 4,568,628 | 2/1986 | Eklund ........................... 430/175 |
| 5,308,735 | 5/1994 | Kanda et al. .................. 430/175 |

FOREIGN PATENT DOCUMENTS

26 26 066  1/1977  Germany .

*Primary Examiner*—Christopher G. Young
*Attorney, Agent, or Firm*—Roberts & Mercanti, LLP

[57] ABSTRACT

A water soluble diazonium salt composition made by the condensation of diazoaryl amines and aldehydes and precipitated to form a polymeric anionic species having both $ZnCl_4^=$ and $HSO_4^-$ moieties. These composition are blended with suitable binders, colorants and other optional components to produce light sensitive coating compositions. When applied to aluminum substrates, these light sensitive coating compositions form lithographic printing plates that are especially stable under high humidity conditions. Such plates may be developed by either water alone or by water which contains surfactants and/or a small amount of an organic solvent.

20 Claims, No Drawings

LIGHT SENSITIVE DIAZONIUM COMPOUNDS HAVING BOTH BISULFATE AND ZINCATE PARTS, METHOD OF MAKING THE COMPOUNDS AND COMPOSITIONS UTILIZING THEM

BACKGROUND OF THE INVENTION

1. Field of the Invention

The present invention relates to light sensitive diazonium compounds. More particularly, the invention pertains to water soluble diazonium salt compounds made by the condensation of diazoaryl amines and aldehydes and precipitated to form a polymeric anionic species having both $ZnCl_4^=$ and $HSO_4^-$ moieties. These compounds are used to produce light sensitive compositions for use in preparing lithographic printing plates that are especially stable under high humidity conditions. These light sensitive compositions are aqueous coatings which may be applied onto aluminum substrates to produce the desired lithographic printing plates. Such plates may be developed by either water alone or by water which contains surfactants and/or a small amount of an organic solvent.

2. Background of the Invention

Light sensitive coating compositions for preparing lithographic priming plates are well known in the art as taught in U.S. Pat. Nos. 4,186,069; 4,224,398; 4,273,851 and 4,288,520, which are incorporated herein by reference. In these known systems the coating is an emulsion mixture of a polymeric binder component having water insoluble polymeric particulates in an aqueous suspension medium, together with a water soluble or water dispersible light sensitive diazonium polymer component. This composition is applied to a suitable substrate and the aqueous suspension medium is evaporated thus producing a two phase mixture of the polymeric binder particulates and light sensitive polymer. When the light sensitive component is imagewise exposed to actinic radiation, species are generated which form a matrix of crosslinked polymer which entraps the water insoluble binder thus preventing the removal of the coating upon treatment with a developer. The imagewise unexposed areas are removed by the developer thus producing image differentiation.

It has long been known to use a coating comprising a water insoluble polymer and light sensitive component mixed with organic solvents for producing lithographic printing plates. Such systems are wasteful of solvents and possibly hazardous to the operator and the environment and further require costly solvent recovery equipment to prevent contamination of the air. The use of an aqueous coating system is considered to be highly desirable.

Known lithographic printing plates made from light sensitive compositions applied from water onto silicate hydrophilized aluminum substrates suffer from the drawback of not having satisfactory stability when stored under high humidity conditions. Storage instability is manifested by the presence of a yellow stain on the aluminum which is observed when the coating is removed by a developer. The yellow stain is caused by the diazo compound which reduces the hydrophilic nature of the silicated aluminum and thus increases its tendency to absorb ink during the printing process. The cause of the aluminum staining is believed to result from the presence of bisulfate at relatively high concentrations in the anion of the diazonium salt. U.S. Pat. No. 4,568,628 claims improved stability lithographic printing plates by adding a combination of a water miscible organic solvent in a concentration as high as 40% based on the weight of the total solvent system and a quaternary nitrogen containing stabilizer to a water soluble diazo polymer and an aqueous cationic or nonionic dispersion of a water insoluble polymer. The addition of such a large amount of organic solvent to the aqueous medium is not a satisfactory solution. It eliminates the advantage of having a completely aqueous or essentially aqueous system.

An object of the present invention is to provide light sensitive water soluble diazonium salt compounds which are oligomers or polymers, which in combination with aqueous latex emulsions can produce printing plates that have satisfactory stability when stored at high humidity. The light sensitive compounds of this invention are prepared by the condensation of diazoaryl amines, preferably 4-diazodiphenylaminebisulfate with aldehydes preferably formaldehyde or p-formaldehyde in sulfuric acid, and subsequently precipitated such that the resultant diazonium compounds have anionic species having both $ZnCl_4^=$ and $HSO_4^-$ moieties.

SUMMARY OF THE INVENTION

The invention provides a composition having the Formula I:

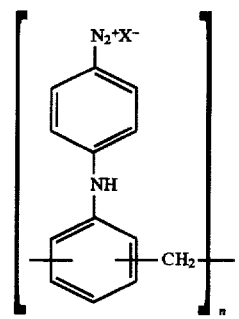

having a mixture of anions $X^-$ comprising from about 45 to about 94 mol percent $ZnCl_4^=$ and from about 6 to about 55 mol percent $HSO_4^-$, and n ranges from about 2 to about 50. Preferably the diphenylamine groups are solely connected by —$CH_2$— groups.

The invention also provides a light sensitive composition which comprises a water dispersible polymeric binder in an mount sufficient to bind the composition components, and a photosensitive composition having the above formula in an amount sufficient to render the composition sensitive to actinic radiation. The invention further provides a photographic element which comprises a substrate, and the above light sensitive composition coated and dried on the substrate. The invention further provides a process for preparing a composition having the above formula which comprises (a) reacting a 4-diazodiphenylamine with an aldehyde in the presence of sulfuric acid, to thereby produce a diazonium polymer;

(b) cooling the result from step (a) with ice water until a temperature of from about 10° C. to about 30° C. is attained, with a sufficient volume of water to produce a concentration of the diazonium polymer ranging from about 0.6 weight percent to about 1.5 weight percent; and (c) precipitating the diazonium polymer resulting from step (b) with zinc chloride in an amount of from about 3 to about 6 times the weight of the diazonium polymer, which zinc chloride is added from an aqueous solution at a concentration of from about 15 weight percent to about the saturation point.

DETAILED DESCRIPTION OF THE PREFERRED EMBODIMENT

The present invention provides a novel polymeric diazonium compound define by Formula I above. The compound contains a mixture of anions $X^-$ including both a tetrachlorozincate $ZnCl_4^=$ moiety and a bisulfate $HSO_4^-$ moiety. In the preferred embodiment, $X^-$ comprises from about 45 to about 94 mol percent $ZnCl_4^=$, more preferably from about 50 to about 88 mol percent $ZnCl_4^=$ and most preferably from about 55 to about 82 mol percent $ZnCl_4^=$. In the preferred embodiment $X^-$ comprises from about 6 to about 55 mol percent $HSO_4^-$, more preferably from about 12 to about 50 mol percent $HSO_4^-$ and most preferably from about 18 to about 45 mol percent $HSO_4^-$. In the preferred embodiment n ranges from about 2 to about 50, more preferably n ranges from about 2 to about 12 and most preferably n ranges from about 2 to about 8.

In the production of the light-sensitive compositions of this invention, one begins by condensing a 4-diazodiphenylamine monomer with an aldehyde in the presence of sulfuric acid. The most preferred diazonium salt compounds of this invention are prepared by the condensation of 4-diazodiphenylamine sulfate with p-formaldehyde in concentrated sulfuric acid. Suitable diazo monomers include but are not restricted to diphenylamine-4-diazonium chloride; diphenylamine-4-diazonium bromide; and diphenylamine-4-diazonium sulfate. In order to form the diazonium compounds of this invention, the sulfuric acid is present in the reaction in an amount of from about 600 mol percent to about 2,600 mol percent, preferably from about 800 mol percent to about 2,000 mol percent and more preferably from about 1,000 mol percent to about 1,600 mol percent based on the number of mols of 4-diazodiphenylamine monomer.

Preferred aldehydes non-exclusively include formaldehyde, paraformaldehyde, acetaldehyde, propionaldehyde, benzaldehyde, and substituted benzaldehyde. Diazo polymers that can be used in the practice of this invention can be made from a molar ratio of diazonium salt monomer to p-formaldehyde that range from about 0.5 to greater than 1. The amount of aldehyde present in the reaction is preferably from about 50 mol percent to about 150 mol percent, more preferably from about 55 mol percent to about 120 mol percent and most preferably from about 60 mol percent to about 100 mol percent based on the number of tools of diazo monomer. The reaction is preferably conducted at a temperature of about 20° C. or less. After the reaction is completed, the reaction is quenched by pouring the reaction solution into an ice/water mixture. This cooling is conducted until a temperature of from about 10° C. to about 30° C. is attained, with a sufficient volume of water to produce a concentration of the diazonium polymer ranging from about 0.6 weight percent to about 1.5 weight percent or more preferably from about 0.6 weight percent to about 1.3 weight percent. The product is precipitated by the slow addition of a concentrated zinc chloride solution followed by filtration, washing with a dilute zinc chloride solution and drying. The amount of zinc chloride used in the precipitation reaction is preferably from about 3 to about 6 times the weight of the diazonium polymer, more preferably from about 4 to about 5 times the weight of the diazonium polymer. The zinc chloride is added from an aqueous zinc chloride solution at a concentration of from about 15 weight percent to about its saturation point, preferably from about 15 weight percent to about 50 weight percent, more preferably from about 20 weight percent to about 40 weight percent. The zinc chloride solution is not added all at once, but rather is added over a period of one or more minutes.

Under these isolation conditions, the anion is a mixture of bisulfate and tetrachlorozincate. A number of factors affect the concentration of the two components in the anion mixture. They are the mount of concentrated sulfuric acid used in the reaction, the quantity of the ice/water mixture used to quench the reaction and the concentration and rate of addition of the zinc chloride solution to precipitate the product. Reduced quantities of sulfuric acid, increased quantities of the ice/water mixture and a slow rate of addition of zinc chloride favors the formation of an anionic structure having a high tetrachlorozincate concentration. The molecular weight of the diazo polymers are determined to a great extent by the molar ratio of diazonium salt monomer and p-formaldehyde. Higher molecular weight materials are produced by decreasing the molar ratio of diazonium salt monomer to p-formaldehyde.

The light sensitive diazonium polymer prepared according to the invention may be used in reproduction layers in the conventional way. The invention provides a photosensitive composition which comprises an admixture of the above light sensitive component diazonium compound of Formula I, in an amount sufficient to form a uniform photosensitive composition and at least one aqueous dispersible polymeric binder compound, which binder is present in an amount sufficient to bind the photosensitive composition in a uniform admixture. Preferably the composition contains a colorant in an amount sufficient to uniformly color the photosensitive composition. The components may be dispersed in water and coated onto supports to form printing plates, color proofing films, and the like.

Many homopolymers and copolymers in aqueous emulsion/dispersion form can be used as the water insoluble polymeric binder in the photosensitive composition. They are acrylics, copolymers of acetate and ethylene, copolymers of styrene and acrylates, polyvinyl acetates, copolymers of vinyl acetate and acrylates, polyurethanes, epoxy resins, saponified epoxy resins, copolymers of allyl alcohol or higher molecular weight unsaturated alcohols, polyhydroxyalkyl acrylates and polyhydroxyalkyl methacrylates and similar polymers. Suitable polymers containing vinyl alcohol units include partially saponified polyvinyl esters, polyvinyl acetals having free hydroxy groups and corresponding reaction products of copolymers with vinyl ester units or vinyl acetal units or vinyl alcohol units. The molecular weight of the polymeric component according to the invention can vary within wide limits. Generally, they have average molecular weights in the range of from about 5,000 to about 200,000 or above, preferably from about 10,000 to about 100,000.

Other components which may be optionally included in the coating composition of this invention include acid stabilizers, exposure indicators, surfactants, plasticizers, photoactivators, wetting agents and colorants. Such are more fully described in U.S. Pat. No. 3,679,419 which is incorporated by reference. For the photosensitive composition of this invention, the polymeric binder, the diazonium salt compound and any additives have to be compatible. They should not react with each other to form a product that is not dispersible.

Colorants such as water soluble dyes and aqueous dispersions of colored pigments can be incorporated into the coating. Their purpose is to produce highly visible images on the aluminum alter the lithographic plate has been exposed to a pattern of light and developed. Suitable materials are methylene blue, triphenylmethane dyes, copper phthalocyanines, halogenated copper phthalocyanine, Rhodamine, Calcozine, Victoria Blue, methyl violet, dioxazine and the like, and such pigments as the anthraquinone type. Generally, the colorant is present in the form of a pigment dispersion which may comprise a mixture of one or more pigments dispersed in water. Water soluble dyes may also be included. When a colorant is used, it is preferably present in the composition of this invention in an amount of from about 2.0% to about 35.0% by weight, more preferably from about 5.0% to about 30.0% and most preferably from about 10.0% to about 25.0% although the skilled artisan may use more or less as desired.

Suitable acid stabilizers useful within the context of this invention include phosphoric, citric, benzoic, m-nitro benzoic, p(p-anilino phenylazo)benzene sulfonic acid, 4,4'-dinitro-2,2'-stilbene disulfonic, itaconic, tartaric and p-toluene sulfonic acid and mixtures thereof. Preferably, the acid stabilizer is phosphoric acid. When used, the acid stabilizer is present in the radiation-polymerizable composition it is preferably present in the amount of from about 0.02% to about 2.0% by weight of the composition, and most preferably from about 0.05% to about 1.0%, although the skilled artisan may use more or less as desired. Exposure indicators (or photoimagers) which may be useful in conjunction with the present invention include 4-phenylazodiphenylamine, eosin, azobenzene, Calcozine Fuchsine dyes and Crystal Violet and Methylene Blue dyes. Preferably, the exposure indicator is 4-phenylazodi phenylamine. The exposure indicator, when one is used, is preferably present in the composition in an amount of from about 0.01% to about 0.35% by weight. A more preferred range is from about 0.02% to about 0.30% and, most preferably, the exposure indicator is present in an amount of from about 0.02% to about 0.20%, although the skilled artisan may use more or less as desired.

The light sensitive diazonium compound is preferably present in the dried photosensitive composition in an amount of from about 5% to about 50% by weight of the composition, more preferably from about 10% to about 40% and most preferably from about 15% to about 20%. The binder is preferably present in the dried photosensitive composition in an amount of from about 50% to about 95% by weight of the composition, more preferably from about 60% to about 90% and most preferably from about 80% to about 85%. The photosensitive composition is prepared by admixing the components in water in an amount sufficient to form a uniformly blended photosensitive composition.

The photosensitive composition is coated and dried onto a suitable substrate to form a photographic element. Substrates useful for coating with the composition of this invention to form a photographic element such as a color proofing film, photoresist or lithographic printing plate include sheets of transparent films such as polymeric films, for example polyester, aluminum and its alloys and other metals, silicon wafers, aluminum clad films coated with copper by vapor deposition or multimetal foils and similar materials which are well known in the art. Preferably, the substrate comprises aluminum.

In the production of photographic elements such as lithographic printing plates, an aluminum substrate is first preferably grained by art recognized methods such as by means of a wire brush, a slurry of particulates or by chemical or electrochemical means, for example in an electrolytic solution comprising hydrochloric acid. The grained plate is preferably then anodized, for example in sulfuric or phosphoric acid in a manner well known in the art. The grained and optionally anodized surface is then preferably rendered hydrophilic by treatment with an alkali metal silicate, such as sodium silicate, polyvinyl phosphonic acid, alkali metal phosphate, hexafluorozirconate, chromate, borate, polyacrylamide and cellulose derivatives by means which are also known to the skilled artisan. The thusly prepared plate is then coated with the composition of the present invention preferably at a coating weight of from about 0.4 $g/m^2$ to about 2.5 $g/m^2$, more preferably from about 0.6 $g/m^2$ to about 2.0 $g/m^2$ and most preferably about 0.65 to about 0.85 $g/m^2$ to form a photographic element. The formed photosensitive composition is applied to the base material and dried in a manner known in the art.

An image is formed by imagewise exposing the photosensitive coating to actinic radiation. After drying, the photosensitive composition can be exposed to an image by means of a film mask or, with suitable sensitization, by means of a laser beam and subsequent development. The composition may be exposed under a exposure mask, using light sources which emit light with the highest possible spectral fraction in the near ultraviolet region. Suitable lasers for irradiation are shorter-wave lasers, for example, Ar lasers, krypton ion lasers, helium/cadmium lasers, emitting in the region of from about 300 to about 600 nm and, for some coatings, even $CO_2$ lasers, which emit at about 10.6 gm, or YAG lasers emitting at about 1.06 µm. Preferably the thus prepared photographic element is exposed to actinic radiation through a negative test flat so as to yield a solid 6 on a 21 step Stouffer exposure wedge after development. Development can be carded out with water or aqueous solutions which contain surfactants and organic solvents. The type of development preferred in each case depends on the composition of the photosensitive mixture. Those photosensitive mixtures are preferred which can be readily dispersed by the developer. For compositions which are not readily dispersible in water, solvents and wetting agents, preferably anionic surfactants are added to water to improve dispersibility. The function of the solvent is to enable the developer to penetrate the coating. Once the coating is penetrated by the solvent, the surfactant in the developer will facilitate the dispersibility of the resin component of the coating in the developer. The developer can contain from about 5 to about 15 percent organic solvent. It is preferred to use solvents having low volatility, for example, araliphatic alcohols, the vapor pressure of which is of no consequence in the handling of the developer. Development can be performed in the conventional manner by developing machines, dipping, spraying, brushing or wiping-over with a pad. The mixtures according to the invention make it possible to prepare lithographic printing plates which have relatively high print runs, good reproduction properties and storage stability meeting practical requirements. They can be processed easily and without staining using developer solutions which are virtually environmentally neutral.

Lithographic printing plates made by coating the mixtures of the inventive diazonium salt compounds with aqueous polymer dispersions onto silicated aluminum have satisfactory stability during storage at high humidity. Under these conditions the silicated aluminum is not substantially stained. The coatings also have excellent oleophilic, photoimaging and adhesion characteristics as well as being thermally stable making them especially suitable for lithographic printing plates. The exact cause of the improved high humidity stability of such lithographic printing plates is not known. Without being bound by any theory, it is believed that the tetrachlorozincate salt of the diazonium compound is more hydrolyrically stable than the bisulfate salt. It will not undergo any hydrolysis which possibly might generate intermediates that will stain aluminum.

The following non-limiting examples serve to illustrate the invention.

EXAMPLE 1

To a plastic tank equipped with external cooling by an ice/water/sodium chloride mixture, are added 19 kilograms of 95% sulfuric acid and 4.54 kilograms of 4-diazodiphenylaminebisulfate (Diazo S, commercially available from Molecular Rearrangement Inc. of Newton, N.J.). Stir to dissolve the components and then cool to 2° C. Continue stirring and within 45 minutes add 306 grams p-formaldehyde in 7 equal portions at about 7 minute intervals maintaining the temperature between 2°–12° C. React 10 more minutes at this temperature. To another tank equipped with agitation means, prepare a mixture of 22 kilograms ice and 157 liters water. Add the above reaction solution over 5 minutes to the stirred ice/water mixture. The reaction product at this stage is water soluble and dissolves in the ice/water mixture.

Prepare a solution of 9.25 kilograms zinc chloride in 23 liters and add it all at once to the stirred diluted reaction solution. A precipitate forms. Continue stirring for 15 more minutes. Filter the product in a centrifuge filter. Prepare a solution of 190 grams zinc chloride in 10 liters water. Wash the precipitate in the filter with the latter zinc chloride solution and dry in a tray dryer oven. This product is identified as Diazo Resin A.

EXAMPLE 2

Add 380 liters of water to a plastic tank equipped with agitation means. Add 4.54 kilograms Diazo Resin A with stirring until it dissolves. To this solution add 16 kilograms 95% sulfuric acid. In another tank, prepare a solution of 18 kilograms zinc chloride in 49 liters water. Within 15 minutes, add this latter solution to the diazo solution and a precipitate forms. Stir for an additional 15 minutes. Filter the product in a centrifuge filter. Wash with 15 liters of a 1.75% zinc chloride solution and dry in a tray dryer oven. This product is Diazo Resin B.

EXAMPLE 3

To a glass beaker having a magnetic stirrer and cooled by immersion into an ice/water bath, add 126 grams 95% sulfuric acid and 30 grams of 4-diazodiphenylaminebisulfate. Stir to dissolve and cool to 7° C. Continue stirring and within 45 minutes add 2.02 grams p-formaldehyde while maintaining the temperature within the range of 7°–13° C. React 10 additional minutes. To another beaker equipped with a stirrer, prepare a mixture of 145 grams ice and 1038 ml water. Add the sulfuric acid reaction solution to the stirred mixture over 5 minutes. The diluted reaction solution is divided into 2 equal parts. To one part, while stirred, add 30.5 grams zinc chloride in 76 ml water all at once. A precipitate forms which is filtered, washed with 50 ml of 1.9% zinc chloride solution and dried. This product is Diazo Resin C. To the other half, add 830 ml water and then while stirring, add 71 grams zinc chloride in 192 ml water. The precipitate that forms is filtered, washed with 50 ml of 1.9% zinc chloride solution and dried. This product is Diazo Resin D.

EXAMPLE 4

To a plastic tank equipped with an agitator and external cooling, add 22.7 kilograms 95% sulfuric acid. Add 5.45 kilograms Diazo S and stir to dissolve. Cool to −3° C. and within 50 minutes add 367.5 grams p-formaldehyde in 7 equal portions at about 8 minute intervals while maintaining the temperature between −3° to 12° C. React 10 more minutes. To another tank equipped with an agitator, prepare a mixture of 26 kilograms ice in 490 liters water. Add the sulfuric acid reaction solution over 5 minutes to the stirred ice/water mixture. Prepare a solution of 25.8 kilograms zinc chloride in 70 liters water which is added in about 10–15 minutes to the stirred diluted reaction solution. A precipitate forms. Continue stirring for 15 minutes. Filter the product in a centrifuge filter. Prepare 20 liters of a 1.75% zinc chloride solution. Wash the product with this solution and dry in a tray dryer oven. This product is Diazo Resin E.

EXAMPLE 5

To a plastic tank equipped with an agitator and external cooling, add 19 kilograms 95% sulfuric acid. Add 4.54 kilograms Diazo S and stir to dissolve. Cool to −10° C. and while stirring add 472 grams p-formaldehyde in 8 equal portions at 15 minute intervals over 1¾ hours. During this time the temperature increases to 7° C. Continue the reaction at this temperature for 45 minutes. To another tank equipped with an agitator, prepare a mixture of 22 pounds of ice and 410 liters of water. To this stirred mixture add the reaction solution within five minutes. Prepare a solution of 21.5 kilograms zinc chloride in 58 liters water which is added rapidly to the stirred reaction solution. A precipitate forms which is stirred for 15 more minutes before filtering. Wash the precipitate with 16 liters of a 1.9% zinc chloride solution and dry in a tray dryer oven. The product is Diazo Resin F.

EXAMPLE 6

To a plastic tank equipped with an agitator and external cooling, add 38 kilograms of 95% sulfuric acid. Then add 9.1 kilograms of Diazo S and stir to dissolve. Cool to −7° C. and while stirring add 612.5 grams p-formaldehyde in 7 equal portions at approximately 8 minute intervals maintaining the temperature at from about −7° to 11° C. React 15 more minutes. To another plastic tank equipped with an agitator, prepare a mixture of 43 kilograms ice and 840 liters water. Add the reaction solution over 5 minutes to the stirred ice/water mixture. Prepare a solution of 46.8 kilograms zinc chloride in 126 liters water which is added within ½ hour to the stirred reaction solution. A precipitate forms and is stirred for 15 minutes before filtering. Prepare 35.5 liters of a 1.8% zinc chloride solution. Wash the precipitate with this solution and dry in a tray dryer oven. This product is Diazo Resin G.

EXAMPLE 7

To a glass beaker having a magnetic stirrer and cooled by immersion into an ice/water bath, add 63 grams 95% sulfuric acid and 15 grams Diazo S. Stir to dissolve and cool to 5° C. Continue stirring and within 55 minutes add 1.01 grams p-formaldehyde maintaining the temperature at 5°–10° C. React 10 more minutes. To another beaker equipped with a stirrer, prepare a mixture of 122 ice and 1320 ml water. Add the sulfuric acid reaction solution to this stirred mixture over 5 minutes. This solution is divided into 2 equal parts. To one part, while stirred, 35.5 grams zinc chloride in 96 ml water is added all at once. The precipitate that forms is filtered, washed with 50 ml 1.9% zinc chloride solution and dried. This product is Diazo Resin H. To the other part while stirred, 35.5 grams zinc chloride in 96 ml water is added over 45 minutes. The precipitate that forms is filtered, washed with 50 ml of 1.9% zinc chloride solution and dried. This product is Diazo Resin I.

EXAMPLE 8

To a glass beaker having a magnetic stirrer and cooled by immersion into an ice/water bath add 63 grams 95% sulfuric acid and 15 grams Diazo S. Stir to dissolve and cool to 5° C. Continue stirring and within 1¾ hours add 1.58 grams p-formaldehyde in 8 equal portions at 15 minute intervals maintaining the temperature at 5°–10° C. React 1½ hours at this temperature. To another beaker equipped with a stirrer prepare a mixture of 122 grams ice and 1320 ml water. Add to this stirred mixture, the sulfuric acid reaction solution within 5 minutes. Prepare a solution of 71 grams zinc chloride in 192 ml water. Add this solution in 15 minutes to the stirred diluted reaction solution. A precipitate forms. Continue stirring for 5 minutes before filtering. Then wash the precipitate with 50 ml of 1.9% zinc chloride solution and dry. This product is Diazo Resin J.

EXAMPLE 9

To a glass beaker having a magnetic stirrer and cooled by immersion into an ice/water bath, add 63 grams 95% sulfuric acid and 15 grams Diazo S. Stir to dissolve and cool to 5° C. Continue stirring and within 1¾ hours add 1.56 grams p-formaldehyde in 8 equal portions at 15 minute intervals maintaining the reaction temperature at 5°–10° C. React 45 more minutes at this temperature. To another beaker equipped with stirring, prepare a mixture of 72 grams ice and 1370 ml water. Add the sulfuric acid reaction solution to this stirred mixture within 5 minutes. Prepare a solution of 71 grams zinc chloride in 192 ml water. Add this solution over 5 minutes to the stirred diluted reaction solution. A precipitate forms which is filtered, washed with 50 ml of 1.9% zinc chloride solution and dried. This product is Diazo Resin K.

EXAMPLE 10

The diazo resins prepared in Examples 1 through 9 are mixtures of the diazonium salt compound and zinc chloride. Chlorine, zinc and sulfur analyses were performed on Diazo Resins A, B, C, D, E, F, G and K. Based on their analyses proposed structures are:

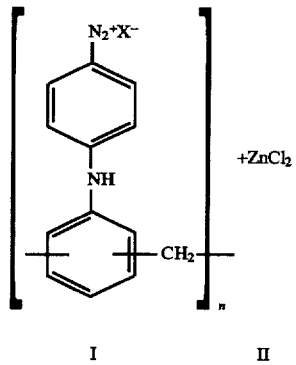

I    II

For Diazo Resins A and C, I is 85%, II is 15% and $X^-$ is a combination of 0.70 $HSO_4^-$ and 0.15 $ZnCl_4^=$. For this structure the calculated percent of zinc, chlorine and sulfur and the percent of these elements found in Diazo Resin A and C are:

|  | % Calculated | % Found Diazo Resin A | Diazo Resin C |
|---|---|---|---|
| Zinc | 9.93 | 10.89 | 10.45 |
| Chlorine | 13.65 | 14.13 | 12.56 |
| Sulfur | 6.21 | 6.07 | 6.42 |

For Diazo Resin F, I is 90%, II is 10%, and $X^-$ is a combination of 0.54 $HSO_4^-$ and 0.23 $ZnCl_4^=$. For this structure the calculated percent of zinc, chlorine and sulfur and the percent of these elements found in Diazo Resin F are:

|  | % Calculated | % Found |
|---|---|---|
| zinc | 9.69 | 10.36 |
| chlorine | 15.74 | 16.24 |
| sulfur | 5.05 | 5.06 |

For Diazo Resin K, I is 95%, II is 5% and $X^-$ is a combination of 0.32 $HSO_4^-$ and 0.34 $ZnCl_4^=$. For this structure the calculated and found percentages of zinc, chlorine and sulfur are:

|  | % Calculated | % Found |
|---|---|---|
| zinc | 8.23 | 8.74 |
| chlorine | 17.35 | 16.67 |
| sulfur | 3.14 | 3.11 |

For Diazo Resin E, I is 95%, II is 5% and $X^-$ is a combination of 0.30 $HSO_4^-$ and 0.35 $ZnCl_4^=$. The calculated and found percentages of zinc, chlorine and sulfur are:

|  | % Calculated | % Found |
|---|---|---|
| zinc | 9.43 | 10.17 |
| chlorine | 17.78 | 17.81 |
| sulfur | 2.95 | 3.02 |

For Diazo Resin B and D, I is 95%, II is 5% and $X^-$ is a combination of 0.24 $HSO_4^-$ and 0.38 $ZnCl_4^-$. For this structure the calculated percent of zinc, chlorine and sulfur and the percent of these elements found in the two diazo resins are:

|  | % Calculated | % Found Diazo Resin B | Diazo Resin D |
|---|---|---|---|
| zinc | 10.02 | 11.55 | 10.61 |
| chlorine | 19.04 | 18.90 | 18.60 |
| sulfur | 2.36 | 2.49 | 2.30 |

For Diazo Resin G, I is 97.5%, II is 2.5% and X is a combination of 0.12 $HSO_4^-$ and 0.44 $ZnCl_4^-$. The calculated and found percentages of zinc, chlorine and sulfur are:

|  | % Calculated | % Found |
|---|---|---|
| zinc | 10.22 | 10.12 |
| chlorine | 20.81 | 19.99 |
| sulfur | 1.21 | 1.25 |

The other diazo resins that were prepared were analyzed only for sulfur. The percent sulfur that was found for these materials are:

| Diazo Resin | % Sulfur |
|---|---|
| H | 4.21 |
| I | 1.69 |
| J | 2.58 |

A low percent of sulfur in the diazo resin is an indication of high concentrations of tetrachlorozincate in the anion.

EXAMPLE 11

Prepare a master batch of:

| | |
|---|---|
| Airflex 400 (a vinyl acetate-ethylene copolymer aqueous resin dispersion, 55% solids from Air Products) | 20 grams |
| water | 125 ml |
| Liquaflex BR-2025 (a copper phthalocyanine aqueous dispersion from Drew Chemicals) | 4.6 grams |
| Triton CF-21, 10% (a nonionic surfactant available from Union Carbide) | .3 grams |

The dispersion was thoroughly mixed and divided into 8 equal parts. To each part add 0.55 grams of Diazo Resin A, B, E, F, G, H, I and K. Each dispersion was stirred and using a #4 wire wound rod coated onto a grained anodized silicated aluminum. The coatings were dried by hot air. Strips of the coated aluminum sheets were placed in a 100% humidity chamber for 1, 2, 5 and 7 days. They were then tested by removing the coating by treatment with Subtractive Plate Developer SD-100 (available commercially from Precision Lithograining) and the stain on the aluminum was noted. The results are as follows:

| DIAZO RESIN | | NUMBER OF DAYS IN 100% HUMIDITY CHAMBER | | | |
|---|---|---|---|---|---|
| | | 1 | 2 | 5 | 7 |
| IN COATING | % SULFUR | Degree of Stain | | | |
| A | 6.07 | much | much | much | much |
| B | 2.49 | none | none | none | trace |
| E | 3.02 | none | none | none | trace |
| F | 5.06 | much | much | much | much |
| G | 1.25 | none | none | none | none |
| H | 4.21 | none | none | much | much |
| I | 1.69 | none | none | none | none |
| K | 3.11 | none | none | trace | slight |

Those coatings made from Diazo Resin A, F and H are not stable when stored at high humidity. Those diazo resins have an anion composition comprised of bisulfate and tetrachlorozincate outside the scope of this invention.

EXAMPLE 12

Prepare the following compositions:

| | A | B |
|---|---|---|
| Airflex 400 | 2.5 gram | 2.5 grams |
| water | 15 ml | 15 ml |
| Triton CF-21, 10% | 4 drops | 4 drops |
| Liquaflex BR-2025 | .6 gram | .6 gram |

-continued

| | A | B |
|---|---|---|
| Diazon 7 (from MRI) | .55 gram | — |
| Diazo Resin #4 (From Fairmount) | — | .55 gram |

Both compositions were coated onto grained anodized silicated aluminum. After being placed in the 100% humidity chamber for one day, both plates showed significant staining on the aluminum after the coatings were removed by treatment with SD-100. They are not of sufficient stability.

EXAMPLE 13 (COMPARATIVE)

Commercially available diazonium salt compounds are analyzed, namely, Diazo Resin #4 available from Fairmount Chemical Co., Inc. of Newark, N.J. and Diazon 7 available from MRI. Both Diazo Resin #4 and Diazon 7 were analyzed for zinc, chlorine, sulfur and sodium. These products are mixtures of the diazonium salt compound and zinc and sodium salts. Based on the elemental analyses, the proposed structures are:

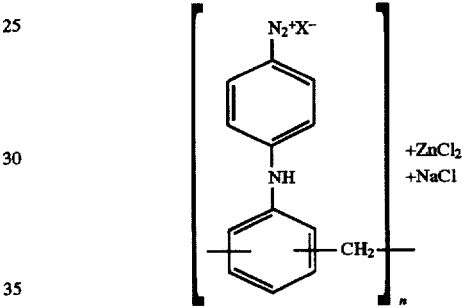

For Diazon 7, $X^-$ is a combination of 0.7 $HSO_4^-$ and 0.15 $ZnCl_4^=$ and the concentration in the mixture of diazonium salt compound, zinc chloride and sodium chloride is 87.15%, 11% and 1.85%, respectively. For Diazo Resin #4, $X^-$ is a combination of 0.54 $HSO_4^-$, and 0.23 $ZnCl_4^=$ and the concentration in the mixture of diazonium salt compound, zinc chloride and sodium chloride is 93.22%, 5% and 1.78%, respectively. For these structures the found and calculated percentages of the elements are:

| | Diazon 7 | |
|---|---|---|
| | Percent Found | Percent Calculated |
| Chlorine | 13.53 | 12.84 |
| Sulfur | 6.45 | 6.36 |
| Zinc | 7.91 | 8.09 |
| Sodium | .73 | .73 |

| | Diazo Resin #4 | |
|---|---|---|
| | Percent Found | Percent Calculated |
| Chlorine | 13.46 | 13.51 |
| Sulfur | 4.79 | 5.23 |
| Zinc | 5.67 | 6.96 |
| Sodium | .70 | .70 |

Diazo Resin #4 and Diazon 7 have anions containing a high percent of bisulfate. In contrast, the diazonium salt compounds of this invention have anion structures of high tetrachlorozincate concentrations.

EXAMPLE 14

This example illustrates the properties of additional coatings made from Diazo Resins B, E, G and H and includes testing after storage at 100% humidity and also in an oven at 55°–60° C.

Prepare the following dispersions:

|  | UNIT | A | B | C | D |
|---|---|---|---|---|---|
| Airflex 400 | gram | 2.5 | 2.5 | 2.5 | 2.5 |
| water | ml | 5 | 5 | 5 | 5 |
| Triton CF-21, 10% | gram | .05 | .05 | .05 | .05 |
| Liquaflex BR-2025, 5% | ml | 11 | 11 | 11 | 11 |
| Diazo Resin B | gram | .25 | — | — | — |
| Diazo Resin E | gram | — | .25 | — | — |
| Diazo Resin G | gram | — | — | 25 | — |
| Diazo Resin I | gram | — | — | — | .25 |

The dispersions were stirred thoroughly before being coated onto grained, anodized and silicated sheets of aluminum using a #4 wire wound rod. The coatings were dried by hot air. They were tested by light exposure using the high intensity setting of a Magnum Platemaker to 5 units of light through a transparency followed by development with subtractive Plate developer SD-100 (available from Precision Lithograining).

When tested in this manner after storage for two weeks at room temperature and also after storage at 100% humidity at room temperature for one week, all four coated plates produced satisfactory images in the light exposed areas and the coatings in the non-light exposed areas were readily removed by treatment with developer. The aluminum was also not stained in the areas where the coating was removed.

The plates were also tested in this manner after storage in an oven for three days at 55°–60° C. Satisfactory images were produced and the aluminum was not stained where the coating was removed. The purpose of oven aging is to predict stability during long term storage at room temperature. During oven aging some crosslinking of the light sensitive coating can occur which could be manifested by incomplete removal of the non-light exposed coating in the developer. To determine if the unexposed coating is completely removed during development, a further test is performed. After development, the plate is rinsed with water and the excess water is removed by a squeegee. The wet plate is then rubbed gently with a cotton swab that contains a blotch of a typical lithographic ink. The images from all three coatings accepted ink while the non-light exposed areas did not accept ink indicating that the unexposed coating is totally removed and that the three coatings are stable.

EXAMPLE 15

Prepare the following composition:

|  | Unit | A | B |
|---|---|---|---|
| Airflex 400 | gram | 2.5 | 5 |
| Vinac XX-210 | gram | 2.5 | — |
| water | ml | 10 | 15 |
| Triton CF-21, 10% | drop | 4 | 4 |
| tetramethylammonium chloride, 10% | gram | .7 | — |
| propylene glycol | gram | 1 | 1 |
| Liquaflex 3R-2025, 5% | ml | 23 | 18 |
| methylene blue | gram | — | .02 |
| Diazon 7 | gram | .1 | .1 |
| Diazo Resin G | gram | .45 | .45 |

Vinac XX-210 is an aqueous emulsion of a polyvinylacetate homopolymer. Its solids content is 55% and is available from Air Products. The percent sulfur in the above mixtures of Diazon 7 and Diazo Resin G is 2.19%. The dispersions were thoroughly stirred and then coated onto a sheet of grained, anodized and silicated aluminum using a #4 wire wound rod. The coated plates were dried with hot air. After storage at 100% humidity for four days, the unexposed coatings were removed by Developer SD-100. The aluminum below the coatings was not stained.

EXAMPLE 16

Prepare the following compositions:

| Airflex 400 | 2.5 grams |
|---|---|
| water | 5 ml |
| Tego Wet 260, 5% | .5 gram |
| tetramethylammonium chloride, 10% | .35 gram |
| propylene glycol | .5 gram |
| Liquaflex BR-2025, 5% | 11 ml |
| Diazon 7 | .05 gram |
| Diazo Resin G | .225 grams |

Tego Wet 260 is a nonionic surfactant from Goldschmidt Chemical Company having a poly(ether co-siloxane) structure. The dispersion composition was stirred and then coated onto a grained anodized and silicated sheet of aluminum using a #4 wire wound rod. The coating was dried with hot air. After storage for five days at 100% humidity, the aluminum was not stained after the coating was removed with Developer SD-100.

Another coated plate was exposed through a transparency to five units of light from the Magnum Platemaker, developed with SD-100 and placed on a standard lithographic printing press. About 200,000 satisfactory copies were obtained without any wear of the lithographic plate.

EXAMPLE 17

To a glass beaker having magnetic stirring and cooled by immersion into an ice water bath, add 30.6 grams of 95% sulfuric acid and 7.3 grams of Diazo S. Stir to dissolve and cool to 7° C. Continue stirring and within 50 minutes add 0.49 grams p-formaldehyde maintaining the temperature within the range of 7° to 14° C. React 15 more minutes. To another beaker equipped with stirring, prepare a mixture of 35 grams ice and 252 ml water. Add to the stirred mixture, the sulfuric acid reaction solution in 5 minutes. The concentration of the formed diazo polymer in this solution is 2.4% To this solution while stirred add in 3 minutes 15.3 grams zinc chloride in 38 ml water. A tarry precipitate forms which is filtered, washed with 25 ml of 1.9% zinc chloride solution and dried. The percent sulfur in the product was found to be 2.07. This reaction was repeated except that the concentrated zinc chloride solution was added in 15 minutes. The precipitate that forms is also tarry.

EXAMPLE 18

To a glass beaker having magnetic stirring and cooled by immersion into an ice water bath add 56 grams 95% sulfuric acid and 13.3 grams Diazo S. Stir to dissolve and cool to 7° C. Continue stirring and within 50 minutes add 0.90 grams p-formaldehyde maintaining the temperature within the range of 7° to 14° C. React 15 more minutes. To another beaker equipped with stirring, prepare a mixture of 64 grams ice and 705 grams water. Add to the stirred mixture, the sulfuric acid reaction solution in 5 minutes. The concentration of the formed diazo polymer in this solution is 1.7%. Divide this solution into 2 equal parts and to one part while stirred add in 7 minutes 25.4 grams zinc chloride in 67 ml water. A tarry precipitate forms.

To the other part, add 107 ml water. The concentration of the formed diazo polymer in this solution is 1.3%. To this solution while stirred add in 8 minutes 29.6 grams zinc chloride in 80 ml water. A crystalline precipitate forms having a slight amount of tar. It filters readily and after filtering it is washed with 25 ml of a 1.9% zinc chloride solution and dried. Its sulfur content is 1.73%.

EXAMPLE 19

To a glass beaker having magnetic stirring and cooled by immersion into an ice water bath, add 94.5 grams 95% sulfuric acid and 22.5 grams Diazo S. Stir to dissolve and cool to 7° C. Continue stirring and within 50 minutes add 1.52 grams p-formaldehyde maintaining the temperature between 7° to 14° C. React 15 more minutes. To another beaker equipped with stirring, prepare a mixture of 109 grams ice and 2023 ml water. Add to the stirred mixture, the sulfuric acid reaction solution in 5 minutes. The concentration of the formed diazo polymer in this solution is 1.0%. The solution is divided into 3 equal parts and to each part 35.5 grams zinc chloride in 96 ml water is added in 2, 5 and 20 minutes, respectively. Crystalline precipitates form without any tar formation in all three solutions which are filtered, washed with 25 ml of 1.9% zinc chloride solution and dried. The percent sulfur for the three products is:

| PRODUCT | % SULFUR |
|---|---|
| From the zinc chloride addition in 2 minutes | 2.35 |
| From the zinc chloride addition in 5 minutes | 1.93 |
| From the zinc chloride addition in 20 minutes | 1.52 |

An important factor that affects the concentration of the two components in the anion mixture is the rate of addition of the zinc chloride solution to precipitate the product from the aqueous quenched reaction solution. When the zinc chloride solution was added all at once as in the preparation of Diazo Resin A in Example 1, Diazo Resin C in Example 3 and Diazo Resin H in Example 2, products are obtained that have an anion structure having a high concentration of bisulfate. Decreasing the rate of addition of the zinc chloride solution in the precipitation step will produce a product that has the desired reduced bisulfate content. In the preparation of Diazo Resins A and C, the concentration of the formed diazonium polymer in the aqueous quenched reaction solution is about 2.4%. When the reaction conditions for producing Diazo Resins A and C were repeated in Example 16 except that the zinc chloride solution was added in 3 minutes instead of all at once, the product that was obtained had a reduced bisulfate concentration. Its percent sulfur was 2.07. The product is satisfactory but the process for its synthesis is not acceptable. The precipitate that initially formed is a tar which makes its isolation difficult. Satisfactory processes for producing the diazo polymers of this invention have been developed with either a slight amount of tar or no tar formation during the precipitation step. It is based on adding the sulfuric acid reaction solution to larger quantities of ice water to produce the formed diazonium polymer at a concentration in the aqueous quenched reaction solution of about 1.5% or less. At the 1.3% concentration a slight mount of tar formation occurs which is acceptable. When the diazonium polymer concentration is reduced to 1.0% no tar formation occurs.

What is claimed is:

1. A compound having the formula:

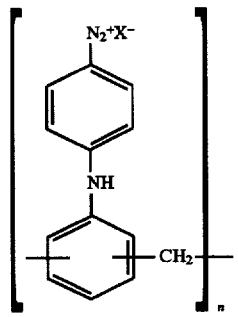

wherein the diphenylamine groups are solely connected by —$CH_2$— groups; and having a mixture of anions $X^-$ comprising from about 45 to about 94 mol percent $ZnCl_4^=$ and from about 6 to about 55 mol percent $HSO_4^-$, and n ranges from about 2 to about 50.

2. The compound of claim 1 wherein n ranges from 2 to about 12.

3. The compound of claim 1 wherein n ranges from 2 to about 8.

4. The compound of claim 1 wherein $X^-$ comprises from about 50 to about 88 mol percent $ZnCl_4^=$ and from about 12 to about 50 mol percent $HSO_4^-$.

5. The compound of claim 1 wherein $X^-$ comprises from about 55 to about 82 mol percent $ZnCl_4^=$ and from about 18 to about 45 mol percent $HSO_4^-$.

6. The compound of claim 1 wherein n ranges from 2 to about 12 and $X^-$ comprises from about 50 to about 88 mol percent $ZnCl_4^=$ and from about 12 to about 50 mol percent $HSO_4^-$.

7. The compound of claim 1 wherein n ranges from 2 to about 8 and $X^-$ comprises from about 55 to about 82 mol percent $ZnCl_4^=$ and from about 18 to about 45 mol percent $HSO_4^-$.

8. A light sensitive composition which comprises a water dispersible polymeric binder in an amount sufficient to bind the composition components, and a compound having the formula:

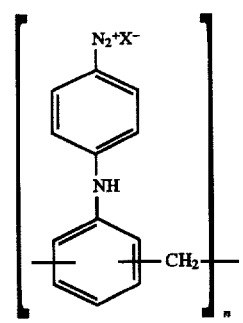

wherein the diphenylamine groups are solely connected by —$CH_2$— groups; and having a mixture of salons X⁻ comprising from about 45 to about 94 mol percent $ZnCl_4^-$ and from about 6 to about 55 mol percent $HSO_4^-$; and n ranges from about 2 to about 50, in an amount sufficient to render the light sensitive composition sensitive to actinic radiation.

9. The light sensitive composition of claim 8 wherein the water dispersible polymeric binder is selected from the group consisting of acrylics, polyvinyl acetates, polyurethanes, epoxy resins, saponified epoxy resins, copolymers of allyl alcohol or higher molecular weight unsaturated alcohols.

10. The light sensitive composition of claim 8 wherein the water dispersible polymeric binder is selected from the group consisting of copolymers of acetate and ethylene, copolymers of styrene and acrylates, copolymers of vinyl acetate and acrylates, polyhydroxyalkyl acrylates and polyhydroxyalkyl methacrylates, saponified polyvinyl esters, and reaction products of copolymers with vinyl ester units or vinyl acetal units or vinyl alcohol units, having average molecular weights in the range of from about 5,000 to about 200,000.

11. A photographic element which comprises a substrate, and the light sensitive composition of claim 8 coated on the substrate.

12. The photographic element of claim 11 wherein the substrate comprises aluminum, silicon or a polymeric film.

13. The photographic element of claim 11 wherein the substrate comprises an aluminum alloy which surface has been treated by one or more of anodizing, graining and hydrophilizing.

14. The photographic element is claim 13 wherein the a water dispersible polymeric binder is a vinyl acetate-ethylene copolymer.

15. The photographic element of claim 14 wherein X⁻ comprises from about 55 to about 82 mol percent $ZnCl_4^-$ and from about 18 to about 45 mol percent $HSO_4^-$.

16. A process for preparing a composition having the formula:

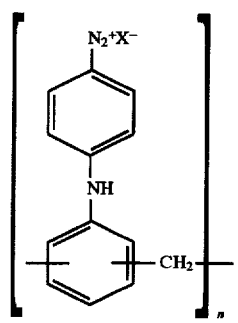

having a mixture or anions X⁻ comprising from about 45 to about 94 mol percent $ZnCl_4^-$ and from about 6 to about 55 mol percent $HSO_4^-$; and n ranges from about 2 to about 50 which comprises (a) reacting a 4-diazodiphenylamine with an aldehyde in the presence of sulfuric acid, to thereby produce a diazonium polymer;

(b) cooling the result from step (a) with ice water until a temperature of from about 10° C. to about 30° C. is attained, with a sufficient volume of water to produce a concentration of the diazonium polymer ranging from about 0.6 weight percent to about 1.5 weight percent; and (c) precipitating the diazonium polymer resulting from step (b) with zinc chloride in an amount of from about 3 to about 6 times the weight of the diazonium polymer, which zinc chloride is added from an aqueous solution at a concentration of from about 15 weight percent to about the saturation point.

17. The process of claim 16 wherein the amount aldehyde reacted in step (a) is from about 50 mol percent to about 150 mol percent based on number of mols of 4-diazodiphenylamine.

18. The process of claim 16 wherein the amount sulfuric reacted in step (a) is from about 600 mol percent to about 2600 mol percent based on the number of mols of 4-diazodiphenylamine.

19. The process of claim 16 wherein the concentration of the diazonium polymer produced in step (b) ranges from about 0.6 weight percent to about 1.3 weight percent.

20. The process of claim 16 wherein the zinc chloride is added in step (c) from an aqueous solution at a concentration of from about 20 weight percent to about 40 weight percent.

* * * * *

UNITED STATES PATENT AND TRADEMARK OFFICE
CERTIFICATE OF CORRECTION

PATENT NO. : 5,688,627
DATED : NOVEMBER 18, 1997
INVENTOR(S) : ALBERT S. DEUTSCH

It is certified that error appears in the above-identified patent and that said Letters Patent is hereby corrected as shown below:

In the claims:

In claim 1, column 16, line 28, change " $ZnCl_4^-$ " to — $ZnCl_4^=$ —

In claim 8, column 17, line 3, change " $ZnCl_4^-$ " to — $ZnCl_4^=$ —

On column 3, line 49, change "tools" to —mols—.
On column 6, line 28, change "gm" to — μm —.
On column 6, line 32 change "carded" to — carried —
On column 7, line 2, change "hydrolyrically" to — hydrolytically —.

On column 10, line 44 change " $ZnCl_4^-$ " to — $ZnCl_4^=$ —

On column 10, line 58 change " $ZnCl_4^-$ " to — $ZnCl_4^=$ —

Signed and Sealed this

Twenty-first Day of April, 1998

Attest:

BRUCE LEHMAN

*Attesting Officer*    *Commissioner of Patents and Trademarks*